United States Patent
Matsui

(10) Patent No.: US 12,119,233 B2
(45) Date of Patent: Oct. 15, 2024

(54) ETCHING METHOD

(71) Applicant: SHOWA DENKO K.K., Tokyo (JP)

(72) Inventor: Kazuma Matsui, Tokyo (JP)

(73) Assignee: Resonac Corporation, Tokyo (JP)

( * ) Notice: Subject to any disclaimer, the term of this patent is extended or adjusted under 35 U.S.C. 154(b) by 521 days.

(21) Appl. No.: 17/595,416

(22) PCT Filed: Jan. 12, 2021

(86) PCT No.: PCT/JP2021/000713
§ 371 (c)(1),
(2) Date: Nov. 16, 2021

(87) PCT Pub. No.: WO2021/153219
PCT Pub. Date: Aug. 5, 2021

(65) Prior Publication Data
US 2022/0199419 A1    Jun. 23, 2022

(30) Foreign Application Priority Data
Jan. 30, 2020    (JP) ................. 2020-013874

(51) Int. Cl.
*H01L 21/311*    (2006.01)
(52) U.S. Cl.
CPC .. *H01L 21/31116* (2013.01); *H01L 21/31122* (2013.01)
(58) Field of Classification Search
None
See application file for complete search history.

(56) References Cited

U.S. PATENT DOCUMENTS

2007/0218204 A1 * 9/2007 Garg ................ H01J 37/3244
                                                          118/723 R
2008/0160777 A1   7/2008 Ono et al.
(Continued)

FOREIGN PATENT DOCUMENTS

EP    2 508 500 A1    10/2012
JP    2000-265275 A    9/2000
(Continued)

OTHER PUBLICATIONS

International Search Report dated Feb. 16, 2021, issued by the International Searching Authority in application No. PCT/JP2021/000713.
(Continued)

*Primary Examiner* — Roberts P Culbert
(74) *Attorney, Agent, or Firm* — Sughrue Mion, PLLC

(57) ABSTRACT

An etching method capable of selectively etching an oxide, which method includes an etching step in which an etching target (12) including an oxide is placed in a chamber (10), and the oxide included in the etching target (12) is etched in the chamber (10) using an etching gas containing a fluorine-containing compound including a functional group represented by the chemical formula below:

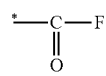

wherein a symbol * means a bonding point with another atom or atomic group. The oxide is at least one of a metal oxide or a semimetal oxide. Further, in the etching step, the etching is performed without generating a plasma of the etching gas in the chamber (10).

20 Claims, 1 Drawing Sheet

(56) References Cited

U.S. PATENT DOCUMENTS

| | | |
|---|---|---|
| 2010/0154835 A1 | 6/2010 | Dimeo et al. |
| 2012/0211023 A1 | 8/2012 | Riva et al. |
| 2012/0298911 A1 | 11/2012 | Hibino et al. |
| 2014/0060571 A1 | 3/2014 | Mitchell et al. |
| 2019/0287812 A1 | 9/2019 | Oomori et al. |

FOREIGN PATENT DOCUMENTS

| | | |
|---|---|---|
| JP | 2003-218100 A | 7/2003 |
| JP | 2010-503977 A | 2/2010 |
| JP | 2013-508990 A | 3/2013 |
| JP | 2013-509700 A | 3/2013 |
| JP | 2014-67950 A | 4/2014 |
| JP | 2016-51777 A | 4/2016 |
| TW | 201823517 A | 7/2018 |
| WO | 2012/052858 A1 | 4/2012 |
| WO | 2012/114611 A1 | 8/2012 |

OTHER PUBLICATIONS

R.J. Holland, et al. "Thermal and Photochemical promotion of silicon and silicon dioxide etching by carbonyl difluoride", XP-002798433, J. Appl. Phys., vol. 60, No. 7, Oct. 1, 1986, Princeton, New Jersey (6 pages).

International Preliminary Report on Patentability (with translation of the Written Opinion) dated Jul. 28, 2022, issued in International Application No. PCT/JP2021/000713.

\* cited by examiner

ETCHING METHOD

CROSS REFERENCE TO RELATED APPLICATIONS

This application is a National Stage of International Application No. PCT/JP2021/000713 filed Jan. 12, 2021, claiming priority based on Japanese Patent Application No. 2020-013874 filed Jan. 30, 2020.

TECHNICAL FIELD

The present invention relates to an etching method.

BACKGROUND ART

Metal oxides such as tantalum pentoxide ($Ta_2O_5$) and semimetal oxides such as silicon dioxide ($SiO_2$) are often sued as low dielectric materials and high dielectric materials in the manufacturing of semiconductor elements. When microfabricating a metal oxide or a semimetal oxide into a desired shape, etching using an etching gas is performed. When performing etching, an etching selectivity between a metal oxide film or a semimetal oxide film that is a processing target and a film that is not a processing target mixed on the same substrate is important.

For example, PTL 1 discloses a method for etching a metal oxide by performing plasma etching using a fluorine-containing gas such as nitrogen trifluoride ($NF_3$) or carbonyl fluoride ($COF_2$) as an etching gas. In the method disclosed in PTL 1, the metal oxide is fluorinated with a fluorine-containing gas to form a metal fluoride, and then the metal fluoride is reacted with an organic substance to form a volatile metal compound, which is then volatilized, thereby etching the metal oxide.

Additionally, PTL 2 discloses a method for etching a silicon oxide film by plasma etching using a mixed gas of a fluorocarbon such as hexafluoro-1,3-butadiene and carbonyl fluoride.

CITATION LIST

Patent Literature

PTL 1: WO 2012/052858
PTL 2: JP 2016-51777 A

SUMMARY OF INVENTION

Technical Problem

However, the method disclosed in PTL 1 requires, in order to etch the metal oxide, a two-step process consisting of the step of reacting the metal oxide with a fluorine-containing gas to form a metal fluoride and the step of reacting the metal fluoride with an organic substance to form a volatile metal compound. Therefore, there is a problem of complication of the process. Additionally, since the method disclosed in PTL 1 uses plasma, it is difficult to perform selective etching as described above.

In addition, the method disclosed in PTL 2 has a problem in that a material (such as polysilicon or silicon nitride) not being a processing target as well as the silicon oxide film being the processing target is etched.

It is an object of the present invention to provide an etching method capable of selectively etching at least one of a metal oxide or a semimetal oxide.

Solution to Problem

In order to achieve the object, one aspect of the present invention is as follows [1] to [8]:

[1] An etching method including an etching step in which an etching target including an oxide is placed in a chamber, and the oxide included in the etching target is etched in the chamber by using an etching gas containing a fluorine-containing compound including a functional group represented by a chemical formula below, the oxide being at least one of a metal oxide or a semimetal oxide, in the etching step, the etching being performed without generating a plasma of the etching gas in the chamber, and a symbol * in the chemical formula below meaning a bonding point with another atom or atomic group.

[Chem. 1]

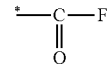

[2] The etching method according to [1], in which in the etching step, the etching is performed with the etching gas without using the plasma of the etching gas.

[3] The etching method according to [1], in which a plasma generation source is located at a position away from the chamber, and in the etching step, the etching is performed in the chamber by the plasma of the etching gas generated outside the chamber by the plasma generation source.

[4] The etching method according to any one of [1] to [3], in which the fluorine-containing compound has from 1 to 5 carbon atoms.

[5] The etching method according to any one of [1] to [3], in which the fluorine-containing compound has from 1 to 3 carbon atoms.

[6] The etching method according to anyone of claims [1] to [3], in which the fluorine-containing compound is at least one of carbonyl fluoride or oxalyl fluoride.

[7] The etching method according to any one of claims [1] to [6], in which a metal of the metal oxide contains at least one selected from tungsten, titanium, tantalum, ruthenium, iridium, and rhodium.

[8] The etching method according to any one of claims [1] to [7], in which a semimetal of the semimetal oxide contains silicon.

Advantageous Effects of Invention

According to the present invention, at least one of a metal oxide or a semimetal oxide can be selectively etched.

DESCRIPTION OF EMBODIMENTS

Figure 1:
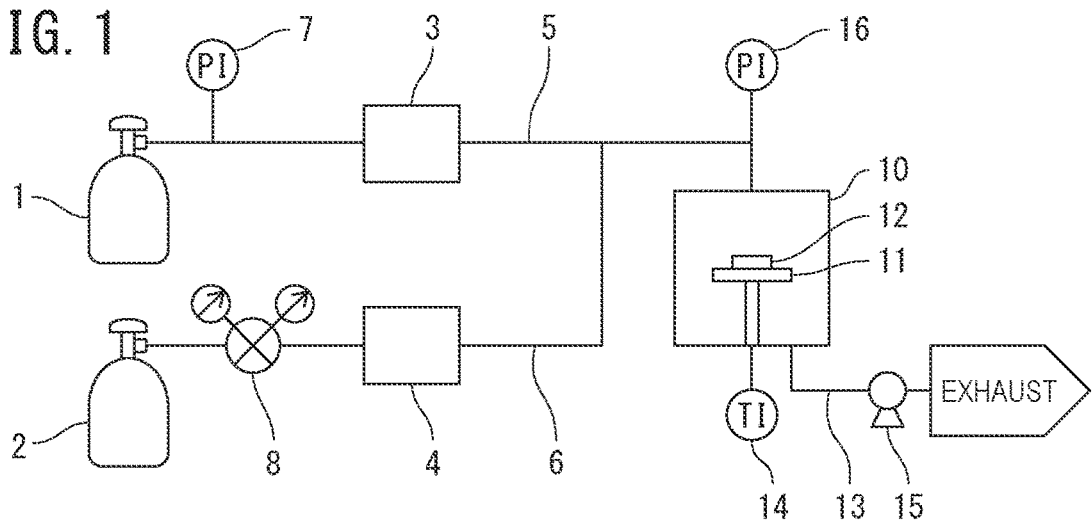
FIG. 1 is a schematic view of one example of an etching device illustrating a first embodiment of an etching method according to the present invention.

An embodiment of the present invention will be described below. It should be noted that the present embodiment is illustrative of one example of the present invention, and the present invention is not limited thereto. Additionally, various changes or improvements can be added to the present invention, and embodiments added with such changes or improvements may also be included in the present invention.

An etching method according to the present invention includes an etching step in which an etching target including an oxide is placed in a chamber, and the oxide included in the etching target is etched in the chamber by using an etching gas containing a fluorine-containing compound including a functional group represented by the above chemical formula. The oxide is at least one of a metal oxide or a semimetal oxide. Additionally, in the etching step, the etching is performed without generating a plasma of the etching gas in the chamber.

When the fluorine-containing compound including a functional group represented by the above chemical formula is brought into contact with the oxide, a carbonyl group in the fluorine-containing compound reacts with an oxygen atom in the oxide to release carbon dioxide, and a fluorine atom in the fluorine-containing compound reacts with a metal or a semimetal to generate volatile metal fluoride or semimetal fluoride, whereby the etching of the oxide proceeds. As an example, a reaction between carbonyl fluoride and silicon dioxide is represented by the following reaction formula:

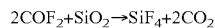

$$2COF_2 + SiO_2 \rightarrow SiF_4 + 2CO_2$$

On the other hand, the fluorine-containing compound including a functional group represented by the above chemical formula hardly reacts with materials other than the oxide (for example, silicon nitride, polysilicon, amorphous carbon, elementary metals, elementary semimetals, metal nitride, semimetal nitride, organic substance, and photoresist). Therefore, applying the etching method according to the present embodiment to an etching target including both the oxide and a material other than the oxide allows the oxide to be selectively etched without almost etching the material that does not need to be etched (for example, silicon nitride, polysilicon, amorphous carbon, an elementary metal, an elementary semimetal, metal nitride, semimetal nitride, organic substance, or photoresist). Thus, the etching method according to the present embodiment can be suitably used for manufacturing a semiconductor element.

The photoresist material refers to a photosensitive composition whose physical properties such as solubility are changed by light, electron beams, or the like. Examples of the photoresist material include photoresist materials for g-line, h-line, i-line, KrF, ArF, $F_2$, EUV, and the like. The composition of the photoresist material is not particularly limited as long as it is commonly used in semiconductor element manufacturing processes. There can be mentioned polymers obtained by polymerizing compounds including functional groups that contribute to polymerization, such as vinyl groups, (meth)acryloyl groups, glycidyl groups, amino groups, and hydroxy groups. Examples of the photoresist material include compositions containing polymers prepared from at least one monomer selected from chain olefins, cyclic olefins, styrene, vinylphenols, (meth)acrylic acids, (meth)acrylates, epoxies, melamines, and glycols. Note that (meth)acrylic acid means one or both of acrylic acid and methacrylic acid, and (meth)acrylate means one or both of acylate and methacrylate.

In addition, since the oxide is etched without generating the plasma of the etching gas in the chamber, the chamber and a pipe connected to the chamber are not prone to corrosion. Furthermore, since the etching can be performed in the one-step process, the oxide can be etched easily and at low cost.

It should be noted that the etching in the present invention means to process the etching target into a predetermined shape (for example, a three-dimensional shape) by removing a part or all of the oxide included in the etching target (for example, processing an oxide film included in the etching target to a predetermined film thickness to form a wiring), and also means to clean the etching target by removing a residue or a deposit composed of the oxide from the etching target (for example, to remove an oxide deposit deposited on a semiconductor element without damaging the semiconductor element), and the like.

Hereinafter, the etching method according to the present embodiment will be described in more detail by taking two examples of first and second embodiments.

First Embodiment

An etching method according to the first embodiment is an etching method (hereinafter may also be referred to as "plasmaless etching") in which in the above etching step, etching is performed with the etching gas without using the plasma of the etching gas (a plasma gas obtained by converting the etching gas into plasma).

The etching method according to the first embodiment can be performed by etching using an etching device provided with no plasma generation source or can be performed by etching using an etching device provided with a plasma generation source inside or outside the chamber without operating the plasma generation source.

The etching method according to the first embodiment will be described in more detail.

[Etching Gas]

The etching gas to be used is a gas that contains a fluorine-containing compound including a functional group represented by the above chemical formula. The type of the fluorine-containing compound is not particularly limited as long as it includes a functional group represented by the chemical formula. However, from the viewpoint of high volatility and ease of handling as a gas, the fluorine-containing compound has preferably 1 to 5 carbon atoms, more preferably 1 to 3 carbon atoms, and most preferably 1 or 2 carbon atoms.

Specific examples of the fluorine-containing compound include formyl fluoride, carbonyl fluoride, oxalyl fluoride, 2,2,2-trifluoroacetylfluoride, 2,2-difluoroacetylfluoride, 2-fluoroacetylfluoride, acetylfluoride, 2,2,3,3,3-pentafluoropropanoyl fluoride, 2,2,3,3-tetrafluoropropanoyl fluoride, 2,3,3,3-tetrafluoropropanoyl fluoride, 3,3,3-trifluoropropanoyl fluoride, 2,3,3-trifluoropropanoyl fluoride, 2,2,3-trifluoropropanoyl fluoride, 2,2-difluoropropanoyl fluoride, 2,3-difluoropropanoyl fluoride, 3,3-difluoropropanoyl fluoride, 2-fluoropropanoyl fluoride, 3-fluoropropanoyl fluoride, propionyl fluoride, 2,3,3,3-tetrafluoro-2-(trifluoromethyl)propanoyl fluoride, and 3,3,3-trifluoro-2,2-bis(trifluoromethyl)propanoyl fluoride.

Among these fluorine-containing compounds, carbonyl fluoride ($COF_2$) and oxalyl fluoride (($COF)_2$) are particularly preferable, and it is particularly preferable to use at least one of carbonyl fluoride or oxalyl fluoride as the fluorine-containing compound.

Additionally, these fluorine-containing compounds may be used alone or in combination of two or more thereof.

The etching gas may be a gas composed of only a fluorine-containing compound or a mixed gas containing a fluorine-containing compound and another kind of gas. When the etching gas is a mixed gas containing a fluorine-containing compound and another kind of gas, the amount of the fluorine-containing compound contained in the etching gas is preferably 1% by volume or more, more preferably 5% by volume or more, and still more preferably 10% by volume or more.

When the etching gas is a mixed gas containing a fluorine-containing compound and another kind of gas, an inert gas can be used as the other kind of gas. In other words, the etching gas may be a mixed gas composed of a fluorine-containing compound and an inert gas. As the inert gas, at least one selected from nitrogen gas ($N_2$), helium (He), neon (Ne), argon (Ar), krypton (Kr), and xenon (Xe) can be used. The amount of the insert gas contained in the etching gas is not particularly limited, but may be more than 0% by volume and 99% by volume or less, and more preferably more than 50% by volume and 90% by volume or less.

[Pressure During Etching]

In the etching step of the etching method according to the first embodiment, the etching target is placed in the chamber, and the etching gas is supplied into the chamber to etch the oxide included in the etching target with the etching gas without using the plasma of the etching gas. In this case, the pressure in the chamber is not particularly limited, but may be from 1 Pa to 101.3 kPa.

For example, the etching target can be placed in the chamber, and etching can be performed while distributing the etching gas in the chamber. The pressure in the chamber during the distribution of the etching gas may be from 1 Pa to 101.3 kPa. The flow rate of the etching gas may be appropriately set so that the pressure in the chamber is maintained constant according to the size of the chamber and the capacity of an exhaust system for reducing the pressure in the chamber.

[Etching Target]

The etching target to be etched by the etching method according to the first embodiment contains the oxide. In other words, the etching target may be a member formed by only the oxide, a member including a portion formed by only the oxide and a portion formed by another material, or a member formed by a mixture of the oxide and another material. The shape of the entire etching target and the shape of the portion formed by only the oxide in the etching target are not particularly limited, and, for example, may be in foil, film, powder, or lump form.

The oxide refers to a compound that contains a metal or semimetal and an oxygen atom as main components thereof, and for example, refers to a compound used as a natural oxide film generated on the surface of a wiring material (an elementary metal, an elementary semimetal, or an alloy thereof), a compound used as a deposit generated on the surface of a wiring material (an elementary metal, an elementary semimetal, or an alloy thereof), a compound used as an insulating film for semiconductor elements, a compound used as a high dielectric material or a low dielectric material in semiconductor elements, or the like. The oxide may contain elements other than metal, semimetal, and oxygen, and may contain elements such as nitrogen, carbon, fluorine, chlorine, bromine, and iodine.

The type of metal of the metal oxide is not particularly limited as long as a volatile metal compound (for example, a metal fluoride or a metal carbonyl) is produced as an etching product. Specific examples thereof include tungsten (W), titanium (Ti), tantalum (Ta), ruthenium (Ru), iridium (Ir), rhodium (Rh), copper (Cu), tin (Sn), hafnium (Hf), nickel (Ni), cobalt (Co), iron (Fe), and alloys of two or more of these metals. Additionally, the type of metal of the semimetal oxide is also not particularly limited, as in the case of the metal of the metal oxide. Silicon (Si) is one specific example thereof.

When the etching target includes the oxide and a non-etching target that is composed of a material other than the oxide and that is not a target to be etched, the oxide can be selectively etched with respect to the non-etching target by the etching method according to the first embodiment. As such an etching target, there may be mentioned substrates including a film of the oxide and a film of a non-etching target.

As the non-etching target film, there may be mentioned at least one film selected from a metal film, a silicon film, a silicon nitride film, and an organic film. Examples of the silicon nitride film include a silicon compound film including a silicon atom and a nitrogen atom, such as $Si_3N_4$(SiN) or SiCN. Examples of the silicon film include a polysilicon film and an amorphous silicon film. Additionally, examples of the organic film include a photoresist film and a film made of a carbon material such as amorphous carbon. Furthermore, examples of the metal film include films made of the above elementary metal, nitrides thereof, carbides thereof, silicides thereof, or the like.

[Etching Device]

Next will be a description of one configuration example of an etching device usable in the etching method according to the first embodiment and one example of a method for etching the oxide using the etching device. The etching device of FIG. 1 is a common etching device used in semiconductor element manufacturing processes, and is a plasmaless etching device for performing plasmaless etching. First, the configuration of the etching device of FIG. 1 will be described.

The etching device of FIG. 1 includes a chamber 10 inside which etching is performed, a stage 11 that supports an etching target 12 to be etched in the chamber 10, a thermometer 14 that measures temperature of the etching target 12, an exhaust pipe 13 for exhausting a gas in the chamber 10, a vacuum pump 15 provided on the exhaust pipe 13 to reduce pressure in the chamber 10, and a pressure gauge 16 that measures the pressure in the chamber 10.

The etching device of FIG. 1 also includes an etching gas supply unit that supplies an etching gas into the chamber 10. The etching gas supply unit includes a fluorine-containing compound gas supply unit 1 that supplies a gas of a fluorine-containing compound including a functional group represented by the above chemical formula, an inert gas supply unit 2 that supplies an inert gas, a fluorine-containing compound gas supply pipe 5 that connects the fluorine-containing compound gas supply unit 1 to the chamber 10, and an inert gas supply pipe 6 that connects the inert gas supply unit 2 to an intermediate portion of the fluorine-containing compound gas supply pipe 5.

Furthermore, the fluorine-containing compound gas supply pipe 5 is provided with a pressure gauge 7 for measuring pressure of the fluorine-containing compound gas and a fluorine-containing compound gas flow rate control device 3 for controlling the flow rate of the fluorine-containing compound gas. Still furthermore, the inert gas supply pipe 6 is provided with an inert gas pressure control device 8 for controlling pressure of the inert gas and an inert gas flow rate control device 4 for controlling the flow rate of the inert gas.

Then, when the fluorine-containing compound gas is supplied as the etching gas to the chamber 10, the fluorine-containing compound gas is supplied to the chamber 10 via the fluorine-containing compound gas supply pipe 5 by sending the fluorine-containing compound gas from the fluorine-containing compound gas supply unit 1 to the fluorine-containing compound gas supply pipe 5.

Additionally, when a mixed gas of the fluorine-containing compound gas and the inert gas is supplied as the etching gas, the fluorine-containing compound gas is sent from the fluorine-containing compound gas supply unit 1 to the fluorine-containing compound gas supply pipe 5, and also the inert gas is sent from the inert gas supply unit 2 to the fluorine-containing compound gas supply pipe 5 via the inert gas supply pipe 6. As a result, the fluorine-containing compound gas and the inert gas are mixed together at the intermediate point of the fluorine-containing compound gas supply pipe 5 to form a mixed gas, and the mixed gas is supplied to the chamber 10 via the fluorine-containing compound gas supply pipe 5.

Configurations of the fluorine-containing compound gas supply unit 1 and the inert gas supply unit 2 are not particularly limited, and, for example, they may be tanks or cylinders. In addition, examples of the fluorine-containing compound gas flow rate control device 3 and the inert gas flow rate control device 4 usable herein include mass flow controllers and flow meters.

When supplying the etching gas to the chamber 10, it is preferable to supply the etching gas while maintaining supply pressure of the etching gas (i.e., a value of the pressure gauge 7 in FIG. 1) at a predetermined value. Specifically, the supply pressure of the etching gas is preferably from 2 Pa to 1 MPa, more preferably from 10 Pa to 0.5 MPa, and still more preferably from 50 Pa to 0.3 MPa. When the supply pressure of the etching gas is within the above range, the etching gas is smoothly supplied to the chamber 10, and load on components (for example, the various devices and pipes) included in the etching device of FIG. 1 is small.

Additionally, the pressure of the etching gas supplied into the chamber 10 is preferably from 0.1 Pa to 101.3 kPa and more preferably from 1 Pa to 70 kPa, from the viewpoint of uniform etching of the surface of the etching target 12. When the pressure of the etching gas in the chamber 10 is within the above range, a sufficient etching rate can be obtained, and the oxide can be easily etched selectively with respect to the non-etching target (a high etching selectivity ratio is easily obtained).

The pressure in the chamber 10 before supplying the etching gas is not particularly limited as long as it is equal to or lower than the supply pressure of the etching gas or lower than the supply pressure of the etching gas. However, for example, the pressure is preferably from $10^{-5}$ Pa to less than 30 kPa, and more preferably from 1 Pa to 10 kPa.

A differential pressure between the supply pressure of the etching gas and the pressure in the chamber 10 before supplying the etching gas is preferably 0.5 MPa or less, more preferably 0.3 MPa or less, and still more preferably 0.1 MPa or less. When the differential pressure is within the above range, the etching gas can be smoothly supplied to the chamber 10.

When supplying the etching gas to the chamber 10, it is preferable to supply the etching gas while maintaining the temperature of the etching gas at a predetermined value. Specifically, the supply temperature of the etching gas is preferably from 10° C. to 100° C.

The temperature of the etching target 12 during etching is preferably from 105° C. to 500° C., more preferably from 110° C. to 450° C., and still more preferably from 120° C. to 400° C. When the temperature thereof is within the above temperature range, the etching of the oxide can proceed smoothly, and the load on the etching device is small, which tends to extend the life of the etching device.

The processing time for the etching (hereinafter may be referred to as "etching time") can be randomly set depending on how much the etching of the oxide is desired. However, when considering production efficiency of the semiconductor element manufacturing process, the etching time is preferably within 60 minutes, more preferably within 40 minutes, and still more preferably within 30 minutes. Note that the etching time refers to a time from when the etching gas is introduced into the chamber 10 to when the etching gas in the chamber 10 is exhausted in order to finish etching.

The etching method according to the first embodiment can be performed using a common plasmaless etching device used in semiconductor element manufacturing processes, such as the etching device of FIG. 1, and the configuration of the etching device usable herein is not particularly limited.

For example, a positional relationship between the fluorine-containing compound gas supply pipe 5 and the etching target 12 is not particularly limited as long as the etching gas can be brought into contact with the etching target 12. It also suffices that the configuration of a temperature control mechanism of the chamber 10 allows the temperature of the etching target 12 to be controlled to any temperature. Accordingly, the temperature control mechanism may be directly provided on the stage 11, or the chamber 10 may be heated or cooled by an external temperature controller from outside the chamber 10.

In addition, the material of the etching device of FIG. 1 is not particularly limited as long as it has a corrosion resistance to a fluorine-containing compound to be used and allows depressurization to a predetermined pressure. For example, a portion of the etching device brought into contact with the etching gas can be made of a metal such as nickel, a nickel-based alloy, aluminum, stainless steel, or platinum, a ceramic such as alumina, a fluororesin, or the like. Specific examples of the nickel-based alloy include INCONEL (registered trademark), HASTELLOY (registered trademark), and MONEL (registered trademark). Additionally, examples of the fluororesin include polytetrafluoroethylene (PTFE), polychlorotrifluoroethylene (PCTFE), tetrafluoroethylene perfluoroalkoxyethylene copolymer (PFA), polyvinylidene fluoride (PVDF), TEFLON (registered trademark), VITON (registered trademark), and KALREZ (registered trademark).

Second Embodiment

An etching method according to the second embodiment is an etching method (hereinafter may also be referred to as "remote plasma etching") in which a plasma generation source is located at a position away from the chamber, and in the etching step, etching is performed in the chamber by a plasma of an etching gas generated outside the chamber by the plasma generation source.

The etching method according to the second embodiment can be performed by supplying the plasma of the etching gas generated by the plasma generation source located at a position away from the chamber into the chamber arranged with an etching target therein and etching the oxide included in the etching target by the plasma of the etching gas. The etching method according to the second embodiment may allow the oxide included in the etching target to be etched at a mild temperature.

A description will be given of one example of the configuration of an etching device usable in the etching method according to the second embodiment and one example of a method for etching the oxide using the etching device, with reference to FIG. 2. However, the etching method according to the second embodiment is substantially the same as the etching method according to the first embodiment except that the etching method includes the plasma generation source, and the etching is performed by the plasma of the etching gas. Therefore, description of the same portions as those of the etching method according to the first embodiment will be omitted, and only different portions will be described.

Figure 2:
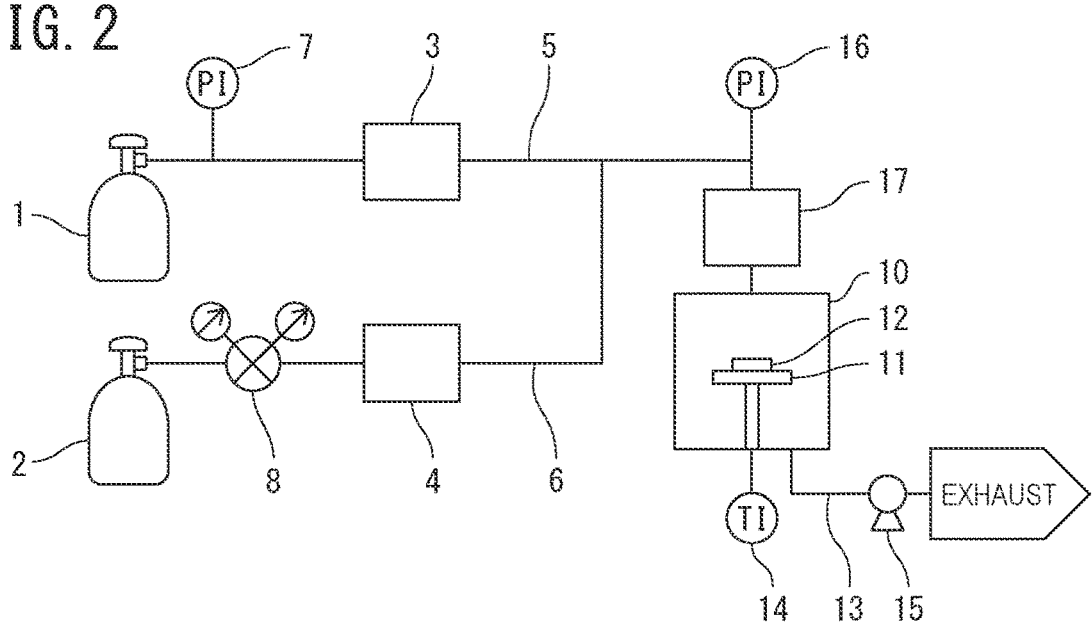
FIG. 2 is a schematic view of one example of an etching device illustrating a second embodiment of the etching method according to the present invention.

The etching device of FIG. 2 is a remote plasma etching device the performs remote plasma etching, and includes a remote plasma generation device 17 being the plasma generation source outside the chamber 10. More specifically, the etching device of FIG. 2 includes the remote plasma generation device 17 at a position between a portion of the fluorine-containing compound gas supply pipe 5 connected with the inert gas supply pipe 6 and the chamber 10.

The etching gas is supplied to the remote plasma generation device 17 via the fluorine-containing compound gas supply pipe 5, and is converted into a plasma of the etching gas by the remote plasma generation device 17. Then, the plasma of the etching gas generated by the remote plasma generation device 17 is supplied to the chamber 10 via the fluorine-containing compound gas supply pipe 5, and is used to etch the oxide included in the etching target. The plasma generation source usable as the remote plasma generation device 17 is not particularly limited, and a commercially available device can be used. For example, an intelligent remote plasma source ASTRON Paragon (registered trademark) manufactured by MKS Instruments Japan, Inc. can be used.

EXAMPLES

Hereinafter, the present invention will be described in more detail with reference to Examples, Comparative Examples, and Reference Examples.

Example 1-1

Using an etching device having substantially the same configuration as that of the etching device of FIG. 1, plasmaless etching of an etching target was performed.

Figure 3:
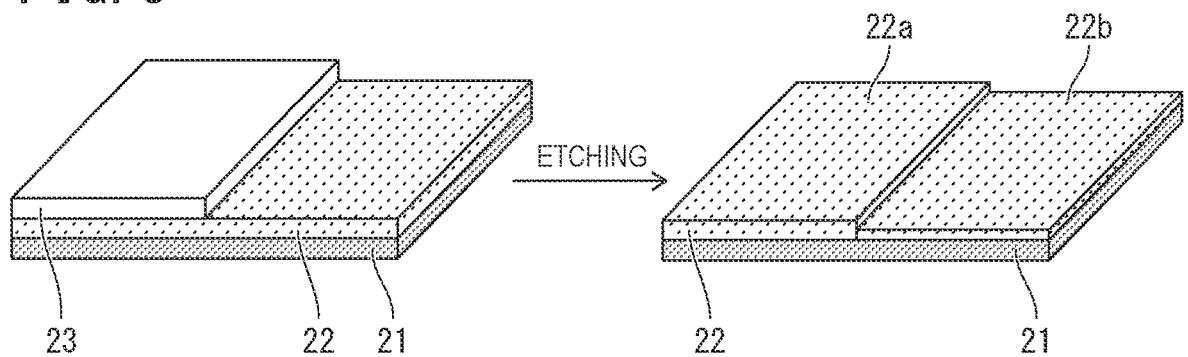
FIG. 3 is a diagram illustrating an etching target used in Examples, Comparative Examples, and Reference Examples.

The etching target used in Example 1-1 will be described with referent to FIG. 3. There was prepared a square silicon substrate 21 having a 2 cm side length formed with a silicon dioxide ($SiO_2$) film 22 having a thickness of 1004 nm thereon. A rectangular alumina substrate 23 having a size of 1 cm×2 cm (thickness: 1 mm) was glued onto the silicon dioxide film 22 using grease (DEMNUM GREASE L-200 manufactured by Daikin Industries, Ltd.) to obtain an etching target. The silicon substrate 21 formed with the silicon dioxide film 22 thereon was manufactured by forming a silicon dioxide film having a thickness of 1004 nm on a circular silicon substrate having a radius of 10 cm and then cutting it into a square shape having a 2 cm side length, and was manufactured by KST World Corporation.

The etching target was placed on a stage in the chamber of the etching device, and the temperature of the stage was raised to 150° C. Next, a carbonyl fluoride gas having a flow rate of 200 mL/min and argon having a flow rate of 800 mL/min were mixed together to obtain a mixed gas, and the mixed gas was used as an etching gas. Then, the etching gas was supplied into the chamber at a flow rate of 1000 mL/min and distributed for 10 minutes for etching. The pressure in the chamber during the distribution of the etching gas was 10 kPa. After completion of the distribution of the etching gas, the heating of the stage was stopped, and the atmosphere in the chamber was replaced with argon.

After opening the chamber and taking out the etching target, the alumina substrate 23 was removed from the etching target and the glued surface thereof was washed with ethanol to remove grease. Then, using an atomic force microscope VN-8010 manufactured by Keyence Corporation, the size of a step difference between a covered surface 22a of the silicon dioxide film 22 covered by the alumina substrate 23 and not etched and an etched surface 22b of the silicon dioxide film 22 not covered by the alumina substrate 23 and etched was measured. Note that conditions for measuring the size of the step difference are as follows.

Measurement pressure: atmospheric pressure (101.3 kPa)
Measurement temperature: 28° C.
Measurement atmosphere: air atmosphere
Scanning range: 80.0 μm in width, 20.0 μm in height, 0° in angle Then, a measurement result of the size (unit: nm) of the step difference was divided by the etching time (unit: min) to calculate a silicon dioxide etching rate (unit: nm/min). Table 1 illustrates the result.

TABLE 1

| | Film | | Fluorine-containing compound gas | | Inert gas | | Stage temperature (° C.) | In-chamber pressure (kPa) | Etching time (min) | Etching rate (nm/min) |
|---|---|---|---|---|---|---|---|---|---|---|
| | Type | Initial film thickness (nm) | Type | Flow rate (mL/min) | Type | Flow rate (mL/min) | | | | |
| Ex. 1-1 | Silicon dioxide | 1004 | Carbonyl fluoride | 200 | Ar | 800 | 150 | 10 | 10 | 2.0 |
| Ex. 1-2 | Silicon dioxide | 1004 | Carbonyl fluoride | 500 | Ar | 500 | 150 | 10 | 10 | 8.1 |
| Ex. 1-3 | Silicon dioxide | 1004 | Carbonyl fluoride | 200 | Ar | 800 | 150 | 50 | 10 | 15.7 |
| Ex. 1-4 | Silicon dioxide | 1004 | Carbonyl fluoride | 200 | Ar | 800 | 300 | 10 | 10 | 10.1 |
| Ex. 1-5 | Silicon dioxide | 1004 | Carbonyl fluoride | 200 | He | 800 | 150 | 10 | 10 | 2.3 |

TABLE 1-continued

| | Film | | Fluorine-containing compound gas | | Inert gas | | Stage temperature (° C.) | In-chamber pressure (kPa) | Etching time (min) | Etching rate (nm/min) |
|---|---|---|---|---|---|---|---|---|---|---|
| | Type | Initial film thickness (nm) | Type | Flow rate (mL/min) | Type | Flow rate (mL/min) | | | | |
| Ex. 1-6 | Silicon dioxide | 1004 | Oxalyl fluoride | 200 | Ar | 800 | 150 | 10 | 10 | 4.7 |
| Ex. 1-7 | Tungsten oxide | 400 | Carbonyl fluoride | 200 | Ar | 800 | 150 | 10 | 10 | 5.1 |
| Ex. 1-8 | Tantalum oxide | 400 | Carbonyl fluoride | 200 | Ar | 800 | 150 | 10 | 18 | 3.0 |
| Ex. 1-9 | Titanium oxide | 400 | Carbonyl fluoride | 200 | Ar | 800 | 150 | 10 | 10 | 4.1 |
| Ex. 1-10 | Ruthenium oxide | 400 | Carbonyl fluoride | 200 | Ar | 800 | 150 | 10 | 10 | 3.3 |
| Ex. 1-11 | Iridium oxide | 400 | Carbonyl fluoride | 200 | Ar | 800 | 150 | 10 | 10 | 2.0 |
| Ex. 1-12 | Rhodium oxide | 400 | Carbonyl fluoride | 200 | Ar | 800 | 150 | 10 | 10 | 2.0 |
| Ref. Ex. 1-1 | Polysilicon | 400 | Carbonyl fluoride | 200 | Ar | 800 | 150 | 10 | 10 | Less than 0.1 |
| Ref. Ex. 1-2 | Silicon nitride | 400 | Carbonyl fluoride | 200 | Ar | 800 | 150 | 10 | 10 | 0.1 |
| Ref. Ex. 1-3 | Silicon carbide | 400 | Carbonyl fluoride | 200 | Ar | 800 | 150 | 10 | 10 | Less than 0.1 |
| Ref. Ex. 1-4 | Photoresist | 400 | Carbonyl fluoride | 200 | Ar | 800 | 150 | 10 | 10 | 0.3 |
| Ref. Ex. 1-5 | Amorphous carbon | 400 | Carbonyl fluoride | 200 | Ar | 800 | 150 | 10 | 10 | 0.2 |
| Ref. Ex. 1-6 | Tungsten | 400 | Carbonyl fluoride | 200 | Ar | 800 | 150 | 10 | 10 | 0.2 |
| Ref. Ex. 1-7 | Titanium nitride | 400 | Carbonyl fluoride | 200 | Ar | 800 | 150 | 10 | 10 | Less than 0.1 |
| Ref. Ex. 1-8 | Tantalum | 400 | Carbonyl fluoride | 200 | Ar | 800 | 150 | 10 | 10 | Less than 0.1 |
| Ref. Ex. 1-9 | Ruthenium | 400 | Carbonyl fluoride | 200 | Ar | 800 | 150 | 10 | 10 | Less than 0.1 |
| Ref. Ex. 1-10 | Iridium | 400 | Carbonyl fluoride | 200 | Ar | 800 | 150 | 10 | 10 | Less than 0.1 |
| Ref. Ex. 1-11 | Rhodium | 400 | Carbonyl fluoride | 200 | Ar | 800 | 150 | 10 | 10 | Less than 0.1 |

Example 1-2

Etching of the etching target was performed in the same manner as in Example 1-1 except that the flow rate of the carbonyl fluoride gas was 500 mL/min and the flow rate of argon was 500 mL/min, and then a silicon dioxide etching rate was calculated. Table 1 illustrates the result.

Example 1-3

Etching of the etching target was performed in the same manner as in Example 1-1 except that the pressure in the chamber was 50 kPa, and then a silicon dioxide etching rate was calculated. Table 1 illustrates the result.

Example 1-4

Etching of the etching target was performed in the same manner as in Example 1-1 except that the temperature of the stage was 300° C., and then a silicon dioxide etching rate was calculated. Table 1 illustrates the result.

Example 1-5

Etching of the etching target was performed in the same manner as in Example 1-1 except that helium was used as the inert gas instead of argon, and then a silicon dioxide etching rate was calculated. Table 1 illustrates the result.

Example 1-6

Etching of the etching target was performed in the same manner as in Example 1-1 except that instead of the carbonyl fluoride gas, an oxalyl fluoride gas was used as the fluorine-containing compound gas, and then a silicon dioxide etching rate was calculated. Table 1 illustrates the result.

Example 1-7

Etching of the etching target was performed in the same manner as in Example 1-1 except that the etching target provided with a tungsten oxide ($WO_3$) film instead of the silicon dioxide film was etched, and then a tungsten oxide etching rate was calculated. Table 1 illustrates the result.

Example 1-8

Etching of the etching target was performed in the same manner as in Example 1-1 except that the etching target provided with a tantalum oxide ($Ta_2O_5$) film instead of the silicon dioxide film was etched, and then a tantalum oxide etching rate was calculated. Table 1 illustrates the result.

Example 1-9

Etching of the etching target was performed in the same manner as in Example 1-1 except that the etching target provided with a titanium oxide ($TiO_2$) film instead of the silicon dioxide film was etched, and then a titanium oxide etching rate was calculated. Table 1 illustrates the result.

Example 1-10

Etching of the etching target was performed in the same manner as in Example 1-1 except that the etching target provided with a ruthenium oxide ($RuO_4$) film instead of the silicon dioxide film was etched, and then a ruthenium oxide etching rate was calculated. Table 1 illustrates the result.

Example 1-11

Etching of the etching target was performed in the same manner as in Example 1-1 except that the etching target provided with an iridium oxide ($IrO_2$) film instead of the silicon dioxide film was etched, and then an iridium oxide etching rate was calculated. Table 1 illustrates the result.

Example 1-12

Etching of the etching target was performed in the same manner as in Example 1-1 except that the etching target provided with a rhodium oxide ($Rh_2O_3$) film instead of the silicon dioxide film was etched, and then a rhodium oxide etching rate was calculated. Table 1 illustrates the result.

Reference Example 1-1

Etching of the etching target was performed in the same manner as in Example 1-1 except that the etching target provided with a polysilicon (Si) film instead of the silicon dioxide film was etched, and then a polysilicon etching rate was calculated. Table 1 illustrates the result.

Reference Example 1-2

Etching of the etching target was performed in the same manner as in Example 1-1 except that the etching target provided with a silicon nitride ($Si_3N_4$) film instead of the silicon dioxide film was etched, and then a silicon nitride etching rate was calculated. Table 1 illustrates the result.

Reference Example 1-3

Etching of the etching target was performed in the same manner as in Example 1-1 except that the etching target provided with a silicon carbide (SiC) film instead of the silicon dioxide film was etched, and then a silicon carbide etching rate was calculated. Table 1 illustrates the result.

Reference Example 1-4

Etching of the etching target was performed in the same manner as in Example 1-1 except that the etching target provided with a cured photoresist film (photoresist TSCR (registered trademark) manufactured by Tokyo Ohka Kogyo Co., LTD.) instead of the silicon dioxide film was etched, and then a photoresist etching rate was calculated. Table 1 illustrates the result.

Reference Example 1-5

Etching of the etching target was performed in the same manner as in Example 1-1 except that the etching target provided with an amorphous carbon film instead of the silicon dioxide film was etched, and then an amorphous carbon etching rate was calculated. Table 1 illustrates the result.

Reference Example 1-6

Etching of the etching target was performed in the same manner as in Example 1-1 except that the etching target provided with a tungsten film instead of the silicon dioxide film was etched, and then a tungsten etching rate was calculated. Table 1 illustrates the result.

Reference Example 1-7

Etching of the etching target was performed in the same manner as in Example 1-1 except that the etching target provided with a titanium nitride (TiN) film instead of the silicon dioxide film was etched, and then a titanium nitride etching rate was calculated. Table 1 illustrates the result.

Reference Example 1-8

Etching of the etching target was performed in the same manner as in Example 1-1 except that the etching target provided with a tantalum film instead of the silicon dioxide film was etched, and then a tantalum etching rate was calculated. Table 1 illustrates the result.

Reference Example 1-9

Etching of the etching target was performed in the same manner as in Example 1-1 except that the etching target provided with a ruthenium film instead of the silicon dioxide film was etched, and then a ruthenium etching rate was calculated. Table 1 illustrates the result.

Reference Example 1-10

Etching of the etching target was performed in the same manner as in Example 1-1 except that the etching target provided with an iridium film instead of the silicon dioxide film was etched, and then an iridium etching rate was calculated. Table 1 illustrates the result.

Reference Example 1-11

Etching of the etching target was performed in the same manner as in Example 1-1 except that the etching target provided with a rhodium film instead of the silicon dioxide film was etched, and then a rhodium etching rate was calculated. Table 1 illustrates the result.

The result of Example 1-1 shows that using an etching gas containing a fluorine-containing compound allows silicon dioxide to be etched even by plasmaless etching.

The results of Examples 1-2 to 1-4 show that the higher the ratio of the fluorine-containing compound in the etching gas, the pressure in the chamber, or the temperature of the stage, the more improved the silicon dioxide etching rate.

The result of Example 1-5 shows that even the use of helium as the inert gas for diluting the fluorine-containing compound allows silicon dioxide to be etched at an etching rate comparable to that of Example 1-1.

The result of Example 1-6 shows that even the use of oxalyl fluoride as the fluorine-containing compound allows silicon dioxide to be etched at an etching rate comparable to that of Example 1-1.

The results of Examples 1-7 to 1-12 show that using an etching gas containing a fluorine-containing compound allows tungsten oxide, tantalum oxide, titanium oxide, ruthenium oxide, iridium oxide, and rhodium oxide to be etched even by plasmaless etching.

On the other hand, the results of Reference Examples 1-1 to 1-11 show that the materials other than the oxides are hardly etched by plasmaless etching.

From the above results, it can be seen that the oxides can be selectively etched by plasmaless etching.

Examples 2-1 to 2-13

Etching of the etching target was performed in the same manner as in Example 1-1 except that a silicon substrate formed with the oxide film listed in Table 2 and a silicon substrate formed with a film of a non-etching target listed in Table 2 were placed side by side on a stage in the same chamber to perform plasmaless etching at a stage temperature and an in-chamber pressure listed in Table 2. The types of oxides and the types of non-etching targets are as listed in Table 2. Then, etching rates of the oxide films and the non-etching target films, respectively, were calculated, and then etching selectivity ratios were calculated from the numerical values. Table 2 illustrates the results. Note that the etching selectivity ratio refers to (etching rate of oxide film)/(etching rate of non-etching target film).

TABLE 2

| | Oxide | | Non-etching target | | | | Etching rate (nm/min) | | |
|---|---|---|---|---|---|---|---|---|---|
| | Type | Initial film thickness (nm) | Type | Initial film thickness (nm) | Stage temperature (° C.) | In-chamber pressure (kPa) | Oxide | Non-etching target | Etching selectivity ratio |
| Ex. 2-1 | Silicon dioxide | 1004 | Silicon nitride | 400 | 150 | 10 | 2.4 | 0.2 | 12.0 |
| Ex. 2-2 | Silicon dioxide | 1004 | Polysilicon | 400 | 150 | 10 | 2.4 | 0.1 | 24.0 |
| Ex. 2-3 | Silicon dioxide | 1004 | Silicon carbide | 400 | 150 | 10 | 2.4 | 0.1 | 24.0 |
| Ex. 2-4 | Silicon dioxide | 1004 | photoresist | 400 | 150 | 10 | 2.4 | 0.4 | 6.0 |
| Ex. 2-5 | Silicon dioxide | 1004 | Amorphous carbon | 400 | 150 | 10 | 2.4 | 0.2 | 12.0 |
| Ex. 2-6 | Silicon dioxide | 1004 | Silicon nitride | 400 | 300 | 10 | 10.1 | 0.6 | 16.8 |
| Ex. 2-7 | Silicon dioxide | 1004 | Polysilicon | 400 | 300 | 10 | 10.1 | 0.5 | 20.2 |
| Ex. 2-8 | Tungsten oxide | 400 | Tungsten | 400 | 300 | 10 | 25.7 | 2.4 | 10.7 |
| Ex. 2-9 | Titanium oxide | 400 | Titanium nitride | 400 | 300 | 10 | 4.0 | 0.1 | 40.0 |
| Ex. 2-10 | Tantalum oxide | 400 | Tantalum | 400 | 300 | 10 | 18.9 | 1.0 | 18.9 |
| Ex. 2-11 | Ruthenium oxide | 400 | Ruthenium | 400 | 300 | 10 | 13.3 | 0.6 | 22.2 |
| Ex. 2-12 | Iridium oxide | 400 | Iridium | 400 | 300 | 10 | 13.2 | 2.0 | 6.6 |
| Ex. 2-13 | Rhodium oxide | 400 | Rhodium | 400 | 300 | 10 | 15.1 | 1.2 | 12.6 |

Examples 3-1 to 3-11

Etching of the etching target was performed in the same manner as in Example 2-1 except that remote plasma etching was performed using an etching device having substantially the same configuration as the etching device illustrated in FIG. 2, a carbonyl fluoride gas having a flow rate of 250 mL/min was used as the etching gas, and an etching time of 30 seconds, a stage temperature of 30° C., and an in-chamber pressure of 0.133 kPa were set. The types of oxides and the types of non-etching targets are as listed in Table 3.

Then, etching rates of the oxide film and the non-etching target film, respectively, were calculated in the same manner as in Example 2-1, and an etching selectivity ratio was calculated from the numerical values. Table 3 illustrates the results. Note that, as a plasma generation source, an intelligent remote plasma source ASTRON Paragon (registered trademark) manufactured by MKS Instruments Japan, Inc. was used at a source power of 7 kW.

TABLE 3

| | Oxide | | Non-etching target | | | | Etching rate (nm/min) | | |
| --- | --- | --- | --- | --- | --- | --- | --- | --- | --- |
| | Type | Initial film thickness (nm) | Type | Initial film thickness (nm) | Stage temperature (° C.) | In-chamber temperature (kPa) | Oxide | Non-etching target | Etching selectivity ratio |
| Ex. 3-1 | Silicon dioxide | 1004 | Silicon nitride | 400 | 30 | 0.133 | 58 | 17 | 3.4 |
| Ex. 3-2 | Silicon dioxide | 1004 | Polysilicon | 400 | 30 | 0.133 | 58 | 29 | 2.0 |
| Ex. 3-3 | Silicon dioxide | 1004 | Silicon carbide | 400 | 30 | 0.133 | 58 | 19 | 3.1 |
| Ex. 3-4 | Silicon dioxide | 1004 | photoresist | 400 | 30 | 0.133 | 58 | 25 | 2.3 |
| Ex. 3-5 | Silicon dioxide | 1004 | Amorphous carbon | 400 | 30 | 0.133 | 58 | 27 | 2.1 |
| Ex. 3-6 | Tungsten oxide | 400 | Tungsten | 400 | 30 | 0.133 | 48 | 19 | 2.5 |
| Ex. 3-7 | Titanium oxide | 400 | Titanium nitride | 400 | 30 | 0.133 | 53 | 12 | 4.4 |
| Ex. 3-8 | Tantalum oxide | 400 | Tantalum | 400 | 30 | 0.133 | 47 | 21 | 2.2 |
| Ex. 3-9 | Ruthenium oxide | 400 | Ruthenium | 400 | 30 | 0.133 | 52 | 22 | 2.4 |
| Ex. 3-10 | Iridium oxide | 400 | Iridium | 400 | 30 | 0.133 | 81 | 34 | 2.4 |
| Ex. 3-11 | Rhodium oxide | 400 | Rhodium | 400 | 30 | 0.133 | 70 | 35 | 2.0 |
| Comp. Ex. 1 | Silicon dioxide | 1004 | Silicon nitride | 400 | 30 | 0.001 | 137 | 115 | 1.2 |
| Comp. Ex. 2 | Silicon dioxide | 1004 | Polysilicon | 400 | 30 | 0.001 | 137 | 237 | 0.6 |
| Comp. Ex. 3 | Silicon dioxide | 1004 | Silicon carbide | 400 | 30 | 0.001 | 137 | 186 | 0.7 |
| Comp. Ex. 4 | Silicon dioxide | 1004 | photoresist | 400 | 30 | 0.001 | 137 | 124 | 1.1 |
| Comp. Ex. 5 | Silicon dioxide | 1004 | Amorphous carbon | 400 | 30 | 0.001 | 137 | 114 | 1.2 |
| Comp. Ex. 6 | Tungsten oxide | 400 | Tungsten | 400 | 30 | 0.001 | 157 | 190 | 0.8 |
| Comp. Ex. 7 | Titanium oxide | 400 | Titanium | 400 | 30 | 0.001 | 37 | 53 | 0.7 |
| Comp. Ex. 8 | Tantalum oxide | 400 | Tantalum | 400 | 30 | 0.001 | 22 | 73 | 0.3 |
| Comp. Ex. 9 | Ruthenium oxide | 400 | Ruthenium | 400 | 30 | 0.001 | 43 | 125 | 0.3 |
| Comp. Ex. 10 | Iridium oxide | 400 | Iridium | 400 | 30 | 0.001 | 65 | 101 | 0.6 |
| Comp. Ex. 11 | Rhodium oxide | 400 | Rhodium | 400 | 30 | 0.001 | 59 | 75 | 0.8 |

Comparative Examples 1 to 11

Etching of the etching target was performed in the same manner as in Example 2-1 except that normal plasma etching was performed, in which a plasma of the etching gas was generated in the chamber and etching was performed in the chamber by the plasma of the etching gas, and conditions for the etching were set as follows. The types of oxides and the types of non-etching targets are as listed in Table 3. Then, etching rates of the oxide film and the non-etching target film, respectively, were calculated in the same manner as in Example 2-1, and an etching selectivity ratio was calculated from the numerical values. Table 3 illustrates the results.

The etching conditions are as follows. The etching gas used was a mixed gas of carbonyl fluoride having a flow rate of 100 mL/min and argon having a flow rate of 900 mL/min. The etching time was 30 seconds, the temperature of the stage was 30° C., and the pressure in the chamber was 0.001 kPa. The etching device used was a parallel plate type plasma CVD system RIE-800iPC manufactured by Samco Inc., where a source power of 500 W and a bias power of 100 W were set.

The results of Examples 2-1 to 2-13 and Examples 3-1 to 3-11 show that even when the oxide and the non-etching target are simultaneously etched by plasmaless etching or remote plasma etching, the oxide can be selectively etched with respect to the non-etching target. It can also be seen that the etching rates of the oxides are faster in the remote plasma etching than in the plasmaless etching, and the etching selectivity is higher in the plasmaless etching than in the remote plasma etching.

On the other hand, the results of Comparative Examples 1 to 11 show that when etching is performed under conditions where plasma is generated in the chamber, the oxides cannot be selectively etched. It can also be seen that the non-etching targets are preferentially etched over the oxides.

REFERENCE SIGNS LIST

1: Fluorine-containing compound gas supply unit
2: Inert gas supply unit 3: Fluorine-containing compound gas flow rate control device
4: Inert gas flow rate control device
5: Fluorine-containing compound gas supply pipe
6: Inert gas supply pipe
7, 16: Pressure gauge
10: Chamber
11: Stage
12: Etching target
13: Exhaust pipe
14: Thermometer
15: Vacuum pump
17: Remote plasma generation device
21: Silicon substrate
22: Silicon dioxide film
23: Alumina substrate

The invention claimed is:

1. An etching method comprising an etching step in which an etching target including an oxide is placed in a chamber, and the oxide included in the etching target is etched in the chamber by using an etching gas containing a fluorine-containing compound including a functional group represented by a chemical formula below,
wherein the oxide is at least one of a metal oxide or a semimetal oxide;
wherein in the etching step, the etching is performed without generating a plasma of the etching gas in the chamber; and,
wherein in the chemical formula below, a symbol * means a bonding point with another atom or atomic group:

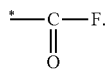

2. The etching method according to claim 1, wherein in the etching step, the etching is performed with the etching gas without using the plasma of the etching gas.

3. The etching method according to claim 1, wherein a plasma generation source is located at a position away from the chamber, and in the etching step, the etching is performed in the chamber by the plasma of the etching gas generated outside the chamber by the plasma generation source.

4. The etching method according to claim 1, wherein the fluorine-containing compound has from 1 to 5 carbon atoms.

5. The etching method according to claim 1, wherein the fluorine-containing compound has from 1 to 3 carbon atoms.

6. The etching method according to claim 1, wherein the fluorine-containing compound is at least one of carbonyl fluoride or oxalyl fluoride.

7. The etching method according to claim 1, wherein a metal of the metal oxide contains at least one selected from tungsten, titanium, tantalum, ruthenium, iridium, and rhodium.

8. The etching method according to claim 1, wherein a semimetal of the semimetal oxide contains silicon.

9. The etching method according to claim 2, wherein the fluorine-containing compound has from 1 to 5 carbon atoms.

10. The etching method according to claim 3, wherein the fluorine-containing compound has from 1 to 5 carbon atoms.

11. The etching method according to claim 2, wherein the fluorine-containing compound has from 1 to 3 carbon atoms.

12. The etching method according to claim 3, wherein the fluorine-containing compound has from 1 to 3 carbon atoms.

13. The etching method according to claim 2, wherein the fluorine-containing compound is at least one of carbonyl fluoride or oxalyl fluoride.

14. The etching method according to claim 3, wherein the fluorine-containing compound is at least one of carbonyl fluoride or oxalyl fluoride.

15. The etching method according to claim 2, wherein a metal of the metal oxide contains at least one selected from tungsten, titanium, tantalum, ruthenium, iridium, and rhodium.

16. The etching method according to claim 3, wherein a metal of the metal oxide contains at least one selected from tungsten, titanium, tantalum, ruthenium, iridium, and rhodium.

17. The etching method according to claim 4, wherein a metal of the metal oxide contains at least one selected from tungsten, titanium, tantalum, ruthenium, iridium, and rhodium.

18. The etching method according to claim 5, wherein a metal of the metal oxide contains at least one selected from tungsten, titanium, tantalum, ruthenium, iridium, and rhodium.

19. The etching method according to claim 6, wherein a metal of the metal oxide contains at least one selected from tungsten, titanium, tantalum, ruthenium, iridium, and rhodium.

20. The etching method according to claim 2, wherein a semimetal of the semimetal oxide contains silicon.

* * * * *